United States Patent
Kim et al.

(10) Patent No.: US 11,955,689 B2
(45) Date of Patent: Apr. 9, 2024

(54) ANTENNA-INSERTED ELECTRODE STRUCTURE AND IMAGE DISPLAY DEVICE INCLUDING THE SAME

(71) Applicant: DONGWOO FINE-CHEM CO., LTD., Jeollabuk-do (KR)

(72) Inventors: Byoung In Kim, Seoul (KR); Chang Jun Maeng, Gyeonggi-do (KR); Yoon Ho Huh, Seoul (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 106 days.

(21) Appl. No.: 17/886,557

(22) Filed: Aug. 12, 2022

(65) Prior Publication Data

US 2022/0384932 A1 Dec. 1, 2022

Related U.S. Application Data

(63) Continuation of application No. PCT/KR2021/001642, filed on Feb. 8, 2021.

(30) Foreign Application Priority Data

Feb. 14, 2020 (KR) .......................... 10-2020-0018291

(51) Int. Cl.
*H01Q 1/22* (2006.01)
*G06F 3/044* (2006.01)
*H01Q 1/36* (2006.01)

(52) U.S. Cl.
CPC ............ *H01Q 1/22* (2013.01); *G06F 3/0446* (2019.05); *H01Q 1/36* (2013.01); *G06F 2203/04111* (2013.01); *G06F 2203/04112* (2013.01)

(58) Field of Classification Search
CPC ...... H01Q 1/22; H01Q 1/243; H01Q 1/36–38; H01Q 1/44; H01Q 9/04; G06F 3/0412; G06F 3/0445–0446; G06F 2203/04112
See application file for complete search history.

(56) References Cited

U.S. PATENT DOCUMENTS 11,169,644 B2 * 11/2021 Kim ..................... H01Q 1/22
2017/0371452 A1 * 12/2017 Endo .................... H01Q 1/526
2021/0173520 A1 * 6/2021 Kida .................... G06F 3/0443

FOREIGN PATENT DOCUMENTS

JP      2013-254375 A    12/2013
KR   10-2011-0045800 A    5/2011

(Continued)

OTHER PUBLICATIONS

International Search Report for PCT/KR2021/001642 dated Jun. 2, 2021.

*Primary Examiner* — Hasan Islam
(74) *Attorney, Agent, or Firm* — The PL Law Group, PLLC (57) ABSTRACT

An antenna-inserted electrode structure according to an embodiment includes a substrate layer comprising a touch sensing area and a touch sensing-antenna area, sensing electrodes disposed on the touch sensing area and the touch sensing-antenna area of the substrate layer, and an antenna unit disposed on the touch sensing-antenna area of the substrate layer, the antenna unit including a radiator. The sensing electrodes and the radiator include a hybrid mesh structure, and the hybrid mesh structure includes a first mesh structure and a second mesh structure integrally combined with each other. The first mesh structure and the second mesh structure have different shapes and arrangements from each other.

15 Claims, 6 Drawing Sheets

(56) References Cited

FOREIGN PATENT DOCUMENTS

| | | |
|---|---|---|
| KR | 10-2013-0095451 A | 8/2013 |
| KR | 10-2014-0016622 A | 2/2014 |
| KR | 10-2018-0097212 A | 8/2018 |
| KR | 10-2018-0133286 A | 12/2018 |
| KR | 10-2019-0090226 A | 8/2019 |
| KR | 10-2019/0105812 A | 9/2019 |
| WO | WO 2010/099132 A2 | 9/2010 |
| WO | WO 2013/063176 A1 | 5/2013 |
| WO | WO 2018/159926 A1 | 9/2018 |

* cited by examiner

ANTENNA-INSERTED ELECTRODE STRUCTURE AND IMAGE DISPLAY DEVICE
INCLUDING THE SAME

CROSS-REFERENCE TO RELATED APPLICATION AND CLAIM OF PRIORITY

The present application is a continuation of application to International Application No. PCT/KR2021/001642, with an International Filing Date of Feb. 8, 2021, which claims the benefit of Korean Patent Application No. 10-2020-0018291 filed on Feb. 14, 2020 at the Korean Intellectual Property Office (KIPO), the disclosures of which are incorporated by reference herein in their entirety.

BACKGROUND

1. Field

The present invention relates to an antenna-inserted electrode structure and an image display device including the same. More particularly, the present invention relates to an antenna-inserted electrode structure including an antenna unit and a sensing electrode and an image display device including the same.

2. Description of the Related Art

Recently, electronic devices capable of inputting a user's direction by selecting an instruction displayed on an image display device with a human hand or an object are implemented by a combination of the image display device and a touch sensor as various shapes such as a smart phones, a tablet PC, etc.

Further, the image display device is being combined with a communication device such as a smart phone. For example, an antenna for implementing high-frequency or ultra-high frequency communication in 3G to 5G or higher bands may be applied to the image display device.

As described above, when the touch sensor and the antenna are applied to one image display device, a design construction for inserting a plurality of electrodes in a limited space is required. For example, if touch sensing electrodes and a radiation electrode of the antenna are formed together, the radiation electrode in a desired shape for achieving a predetermined radiation property may not be easily formed.

Further, when the touch sensing electrodes overlap a pixel structure of the image display device, an image quality of the image display device may be degraded due to an optical phenomenon such as a moire phenomenon.

For example, as disclosed in Korean Published Patent Application No. 2014-0092366, a touch screen panel in which a touch sensor is combined with various image display devices has been recently developed. Korean Patent Publication No. 2013-0095451 discloses an antenna integrated into a display panel.

SUMMARY

According to an aspect of the present invention, there is provided an antenna-integrated electrode structure having improved radiation property and spatial efficiency.

According to an aspect of the present invention, there is provided an image display device including an antenna-integrated electrode structure with improved radiation property and spatial efficiency.

The above aspects of the present invention will be achieved by one or more of the following features or constructions:

(1) An antenna-inserted electrode structure, including: a substrate layer including a touch sensing area and a touch sensing-antenna area; sensing electrodes disposed on the touch sensing area and the touch sensing-antenna area of the substrate layer; and an antenna unit disposed on the touch sensing-antenna area of the substrate layer, the antenna unit including a radiator, wherein the sensing electrodes and the radiator include a hybrid mesh structure, and the hybrid mesh structure includes a first mesh structure and a second mesh structure integrally combined with each other, the first mesh structure and the second mesh structure having different shapes and arrangements from each other.

(2) The antenna-inserted electrode structure according to the above (1), wherein the first mesh structure includes first electrode lines and second electrode lines intersecting each other.

(3) The antenna-inserted electrode structure according to the above (2), wherein the second mesh structure includes third electrode lines and fourth electrode lines intersecting each other, wherein the third electrode lines and the fourth electrode lines extend in different directions from those of the first electrode lines and the second electrode lines to intersect the first electrode lines and the second electrode lines.

(4) The antenna-inserted electrode structure according to the above (3), wherein the third electrode lines and the fourth electrode lines extend from a boundary of the radiator.

(5) The antenna-inserted electrode structure according to the above (4), wherein unit cells are defined by the third electrode lines and the fourth electrode lines intersecting each other, and the boundary of the radiator is defined by one of the unit cells.

(6) The antenna-inserted electrode structure according to the above (5), wherein the boundary of the radiator has a linear shape extending along an extension direction of the third electrode lines and the fourth electrode lines.

(7) The antenna-inserted electrode structure according to the above (3), wherein the radiator includes a first radiator and a second radiator having different sizes, and the hybrid mesh structure further includes a third mesh structure.

(8) The antenna-inserted electrode structure according to the above (7), wherein the third mesh structure includes fifth electrode lines and sixth electrode lines intersecting each other, and the fifth electrode lines and the sixth electrode lines extend in different directions from those of the third electrode lines and the fourth electrode lines.

(9) The antenna-inserted electrode structure according to the above (1), wherein the antenna unit further includes a transmission line formed from the hybrid mesh structure and integrally connected to the radiator, and a signal pad connected to an end portion of the transmission line.

(10) The antenna-inserted electrode structure according to the above (9), wherein the signal pad has a solid structure.

(11) The antenna-inserted electrode structure according to the above (1), wherein the sensing electrodes include first sensing electrodes arranged along a column direction and second sensing electrodes arranged along a row direction.

(12) The antenna-inserted electrode structure according to the above (11), further including connecting portions formed from the hybrid mesh structure and integrally connecting the first sensing electrodes along the column direction; and bridge electrodes electrically connecting the second sensing electrodes to each other along the row direction.

(13) The antenna-inserted electrode structure according to the above (1), wherein sensing electrodes arranged in the touch sensing area have a shape different from that of sensing electrodes adjacent to the radiator in the touch sensing-antenna area.

(14) The antenna-inserted electrode structure according to the above (13), wherein the sensing electrodes adjacent to the radiator have a shape in which the shape of the sensing electrodes arranged in the touch sensing area is cut or partially removed by a boundary of the radiator.

(15) An image display device including the antenna-inserted electrode structure according to embodiments as described above.

In an antenna-inserted electrode structure according to exemplary embodiments of the present invention, a radiator of an antenna unit may be formed at the same layer or at the same level as that of sensing electrodes of a touch sensor and may be disposed between the sensing electrodes. Accordingly, the touch sensor and the antenna unit may be fabricated in a module without an additional a space for accommodating the antenna unit.

In exemplary embodiments, the sensing electrodes and the radiator electrode may share a mesh structure, and the mesh structure may have a hybrid structure of a first mesh structure and a second mesh structure having different shapes. The first mesh structure may include unit cells corresponding to an array of the sensing electrodes of the touch sensor, and the second mesh structure may include extension lines from a boundary of the radiator.

The second mesh structure corresponding to the boundary of the radiator may be mixed with the first mesh structure, so that the radiator may have a substantially seamless boundary. Thus, the radiator having desired frequency and directivity may be realized with high reliability.

Further, two different types of the mesh structures may be hybridized, so that irregularity of an entire mesh structure may increase. Thus, a moire phenomenon due to overlap between the antenna-inserted electrode structure and pixels of the display panel may be prevented.

DETAILED DESCRIPTION OF THE EMBODIMENTS

According to exemplary embodiments of the present invention, there is provided an antenna-inserted electrode structure including an antenna unit and a sensing electrode in the same plane. Further, there is provided an image display device including the antenna-inserted electrode structure.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first direction", "second direction", "third direction", "fourth direction", "column direction" and "row direction" used in herein are not intended to designate an absolute specific direction, but used to relatively distinguish different directions from each other.

Figure 1:
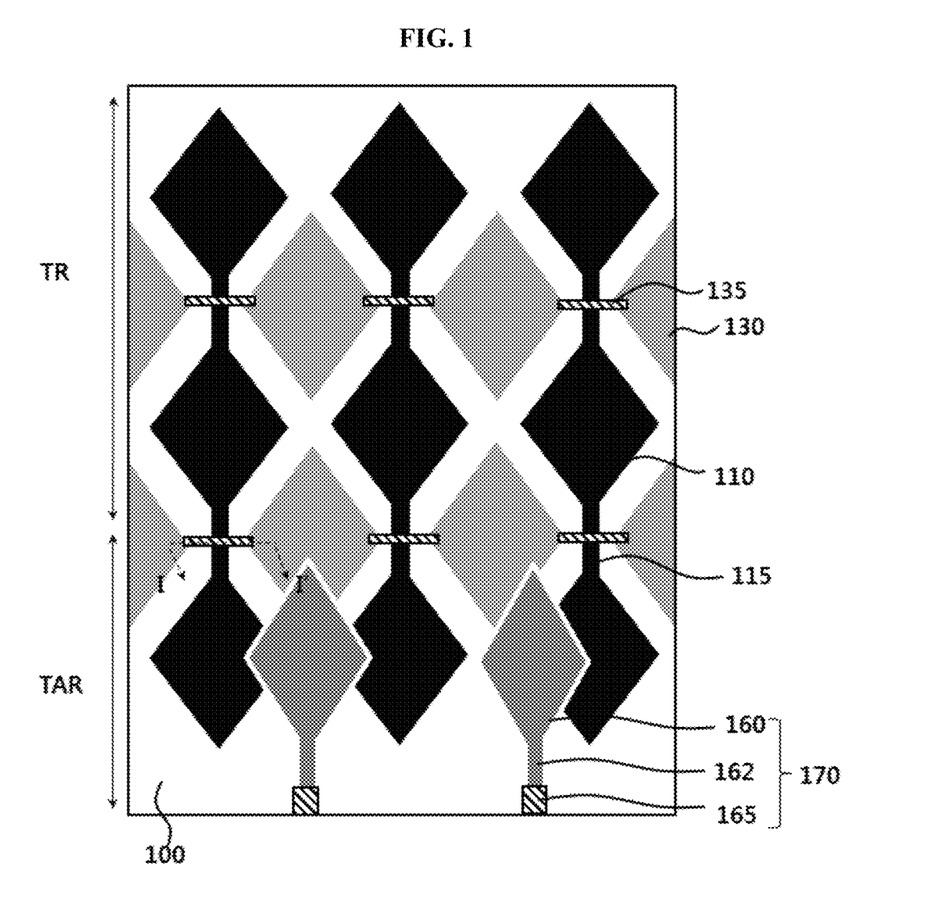
FIG. 1 is a schematic top planar view illustrating an antenna-inserted electrode structure in accordance with exemplary embodiments.
Figure 2:
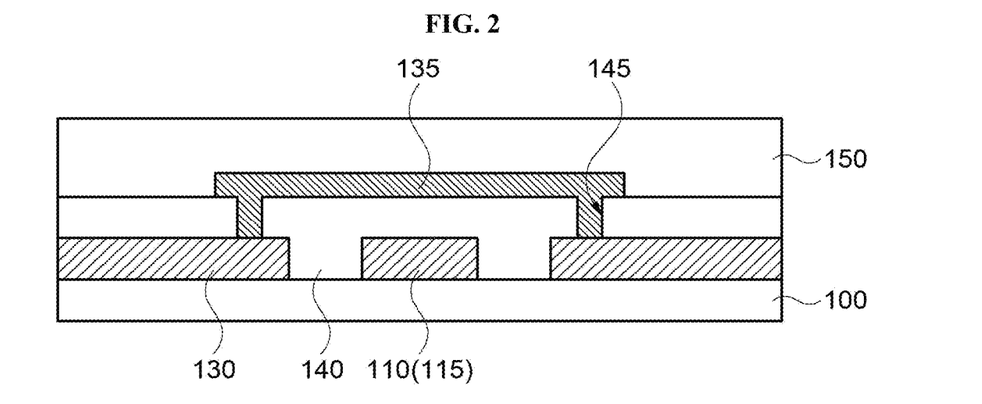
FIG. 2 is a schematic cross-sectional view illustrating a construction of sensing electrodes in an antenna-inserted electrode structure in accordance with exemplary embodiments.

FIG. 1 is a schematic top planar view illustrating an antenna-inserted electrode structure in accordance with exemplary embodiments. FIG. 2 is a schematic cross-sectional view illustrating a construction of sensing electrodes in an antenna-inserted electrode structure in accordance with exemplary embodiments. Specifically, FIG. 2 is a cross-sectional view taken along a line I-I' of FIG. 1 in a thickness direction.

In FIGS. 1 and 2, each electrode is illustrated as a solid pattern for convenience of descriptions on an arrangement of the electrodes of the antenna-inserted electrode structure. However, as will be described later with reference to FIGS. 3 to 5, each electrode may have a mesh structure.

Referring to FIGS. 1 and 2, the antenna-inserted electrode structure may include a substrate layer 100, and sensing electrodes 110 and 130 and an antenna unit 170 arranged on the substrate layer 100, The substrate layer 100 or the antenna-inserted electrode structure may include a touch sensing area TR and a touch sensing-antenna area TAR.

The touch sensing area TR may include a central portion of the substrate layer 100 and may substantially serve as an active area of a touch sensor through which a user's touch input is sensed.

The touch sensing-antenna area TAR may be an area in which the antenna unit 170 for implementing a high-frequency or ultra-high frequency communication (e.g., 3G, 4G, 5G communication or more) may be included. In exemplary embodiments, some of the sensing electrodes 110 and 130 of the touch sensor may be distributed together with the antenna unit 170 in the touch sensing-antenna area TAR.

As illustrated in FIG. 1, the touch sensing-antenna area TAR may be allocated to an end portion or a side portion of the substrate layer 100 to be adjacent to the touch sensing area TR.

First sensing electrodes 110 and second sensing electrodes 130 may be arranged on the touch sensing area TR and the touch sensing-antenna area TAR of the substrate layer 100. In exemplary embodiments, a touch sensing may be implemented by a mutual capacitance between the first and second sensing electrodes 110 and 130.

The substrate layer 100 may include a support layer or a film type substrate for forming the sensing electrodes 110 and 130 and the antenna unit 170. For example, the substrate layer 100 may include a film material commonly used for a touch sensor without particular limitation, and may include, e.g., glass, a polymer, and/or an inorganic insulating material. Examples of the polymer may include cyclic olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), cellulose acetate propionate (CAP), polyethersulfone (PES), cellulose triacetate (TAC), polycarbonate (PC), cyclic olefin copolymer (COC), poly methyl methacrylate (PMMA), etc. Examples of the inorganic insulating material may include silicon oxide, silicon nitride, silicon oxynitride and a metal oxide.

In some embodiments, a layer or film member of an image display device to which the antenna-inserted electrode structure is applied may serve as the substrate layer 100. For example, an encapsulation layer or a passivation layer included in a display panel may serve as the substrate layer 100.

The substrate layer 100 may serve as a dielectric layer of the antenna unit 170. Preferably, a dielectric constant of the substrate layer 100 may be adjusted in a range from about 1.5 to 12. When the dielectric constant exceeds about 12, a driving frequency may be excessively decreased and an antenna driving in a desired high frequency or ultrahigh frequency band may not be implemented.

The first sensing electrodes 110 may be arranged along a column direction (e.g., a Y-direction or a length direction). The first sensing electrodes 110 neighboring each other in the column direction may be connected to each other by a connection portion 115. The first sensing electrodes 110 and the connecting portion 115 may be integrally connected to each other to be substantially provided as a single member. In this case, the first sensing electrodes 110 and the connecting portion 115 may be formed by the same patterning process using the same conductive layer (e.g., a mesh structure), and may be located at the same layer or at the same level.

Accordingly, a first sensing electrode column extending in the first direction may be defined, and a plurality of the first sensing electrode columns may be arranged along a row direction.

The second sensing electrodes 130 may be arranged along the row direction (e.g., an X-direction or a width direction). The second sensing electrodes 130 may each have an independent island pattern shape, and the second sensing electrodes 130 neighboring in the row direction may be electrically connected to each other by a bridge electrode 135.

Accordingly, a second sensing electrode row extending in the row direction may be defined, and a plurality of the second sensing electrode rows may be arranged along the column direction.

FIG. 1 illustrates and example that the second sensing electrode row includes the bridge electrode 135 and the first sensing electrode column includes the connection portion 115. However, the first sensing electrode column may be defined by the bridge electrode, and the second sensing electrode row may be defined by the connecting portion.

The sensing electrodes 110 and 130 and/or the bridge electrode 135 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), molybdenum (Mo), tin (Sn), calcium (Ca) or an alloy containing at least one of the metals (e.g., silver-palladium-copper (APC)) or a copper alloy (e.g., a copper-calcium (CuCa)). These may be used alone or in combination thereof.

The sensing electrodes 110 and 130 and/or the bridge electrode 135 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 110 and 130 and/or the bridge electrode 135 may have a multi-layered structure including a metal or alloy layer, and a transparent metal oxide layer. For example, the sensing electrodes 110 and 130 and/or the bridge electrode 135 may include a double-layered structure of a transparent conductive oxide layer-metal layer or a triple-layered structure of a first transparent conductive oxide layer-metal layer-second transparent conductive oxide layer.

In this case, flexible properties may be improved by the metal layer, and a resistance may also be reduced by the metal layer to increase a signal transmission speed. Anti-corrosive and transparent properties may be improved by the transparent conductive oxide layer.

As illustrated in FIG. 2, an insulating layer 140 may be formed on the substrate layer 100 to at least partially cover the sensing electrodes 110 and 130 and the connecting portion 115. The bridge electrode 135 may be disposed on the insulating layer 140 to electrically connect the neighboring second sensing electrodes 130 to each other through, e.g., a contact hole 145 formed in the insulating layer 140.

A passivation layer 150 for protecting the touch sensor may be formed on the insulating layer 140 and the bridge electrode 135.

The insulating layer 140 and the passivation layer 150 may include an inorganic insulating material such as silicon oxide or silicon nitride, and/or an organic insulating material such as an acrylic resin or a siloxane resin.

In some embodiments, the sensing electrodes 110 and 130 and the bridge electrode 135 may be arranged in a bottom-bridge structure. In this case, the bridge electrode 135 may be disposed under the sensing electrodes 110 and 130. For example, the bridge electrode 135 may include a low-resistance metal, and may be disposed to be away from a visible surface (e.g., a top surface of the passivation layer 150), so that a channel resistance and an electrode visual recognition by a light may be reduced.

The sensing electrodes 110 and 130 and the antenna unit 170 may be arranged together on the touch sensing-antenna area TAR of the substrate layer 100. In exemplary embodiments, the sensing electrodes 110 and 130 and the antenna unit 170 may be located at the same layer or at the same level.

The antenna unit 170 may include a radiator 160, a transmission line 162 and a signal pad 165. A boundary of the radiator 160 may have a polygonal shape such as a rhombus shape or a diamond shape. The transmission line 162 may extend from one end of the radiator 160. The signal pad 165 may be electrically connected to an end portion of the transmission line 162.

The antenna unit 170 may include a conductive material substantially the same as or similar to that of the sensing electrodes 110 and 130. For example, the antenna unit 170 may include the above-described metal or alloy, or a transparent conductive oxide, and may have a multi-layered structure of a metal layer and a transparent conductive oxide layer.

As will be described later with reference to FIGS. 4 and 5, the radiator 160 and the transmission line 162 may be formed from a mesh structure including a plurality of electrode lines intersecting each other therein. In an embodiment, the radiator 160 and the transmission line 162 may be formed as a substantially single member formed from the mesh structure.

The signal pad 165 may be formed as, e.g., a solid pattern including the above-described metal or alloy to reduce a feeding resistance. In an embodiment, a ground pad (not illustrated) may be further disposed around each signal pad 165. The signal pad 165 may be electrically connected to an antenna driving IC chip through a conductive intermediate structure such as a flexible printed circuit board (FPCB) and an anisotropic conductive film (ACF).

The radiator 160 may have a shape inserted between the sensing electrodes 110 and 130 in the touch sensing-antenna area TAR. Accordingly, the sensing electrodes 110 and 130 adjacent to the radiator 160 may have shape partially cut or removed by the radiator 160 from a shape of the sensing electrodes 110 and 130 in the touch sensing area TR.

As described above, the radiator 160 of the antenna unit 170 may be disposed on the same plane or at the same level as that of the sensing electrodes 110 and 130 and may be disposed between the sensing electrodes 110 and 130. Thus, the antenna unit 170 may be integrated with a touch sensor so that a touch sensing and an antenna radiation may be implemented together from one electrode layer.

Figure 3:
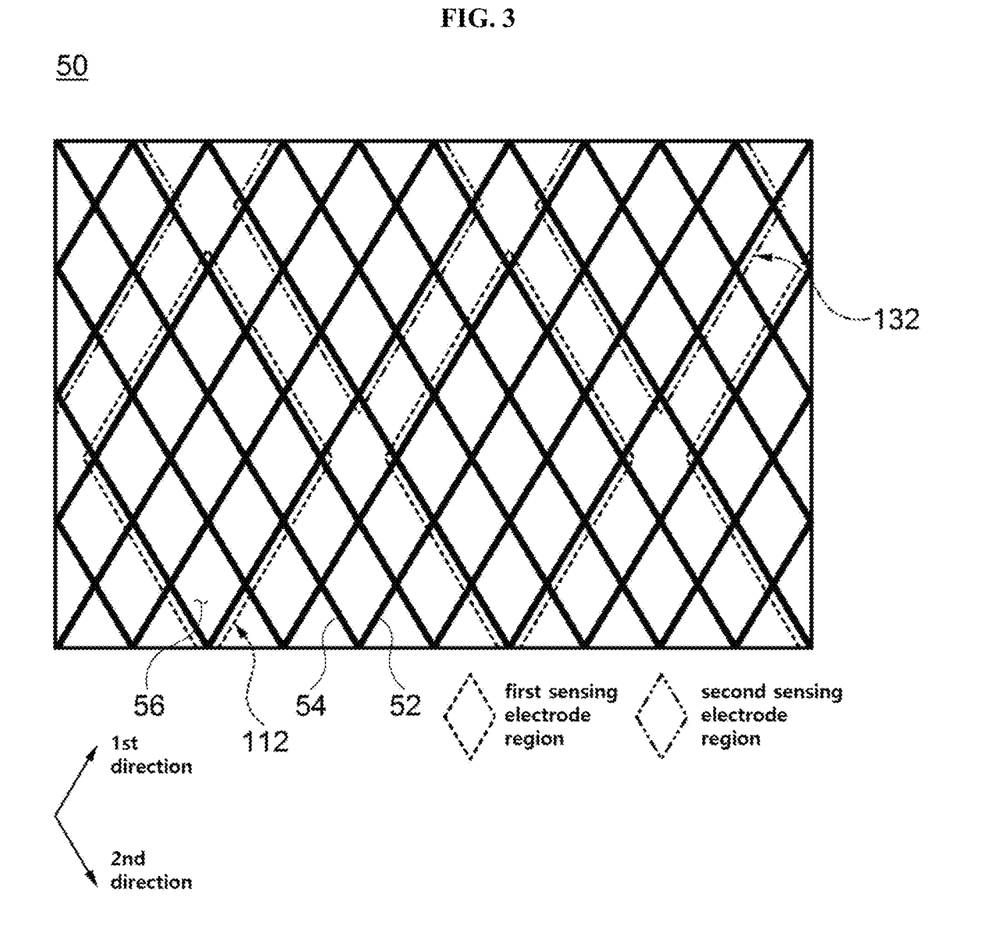
FIG. 3 is a schematic top planar view illustrating a first mesh structure of an antenna-inserted electrode structure in accordance with exemplary embodiments.
Figure 4:
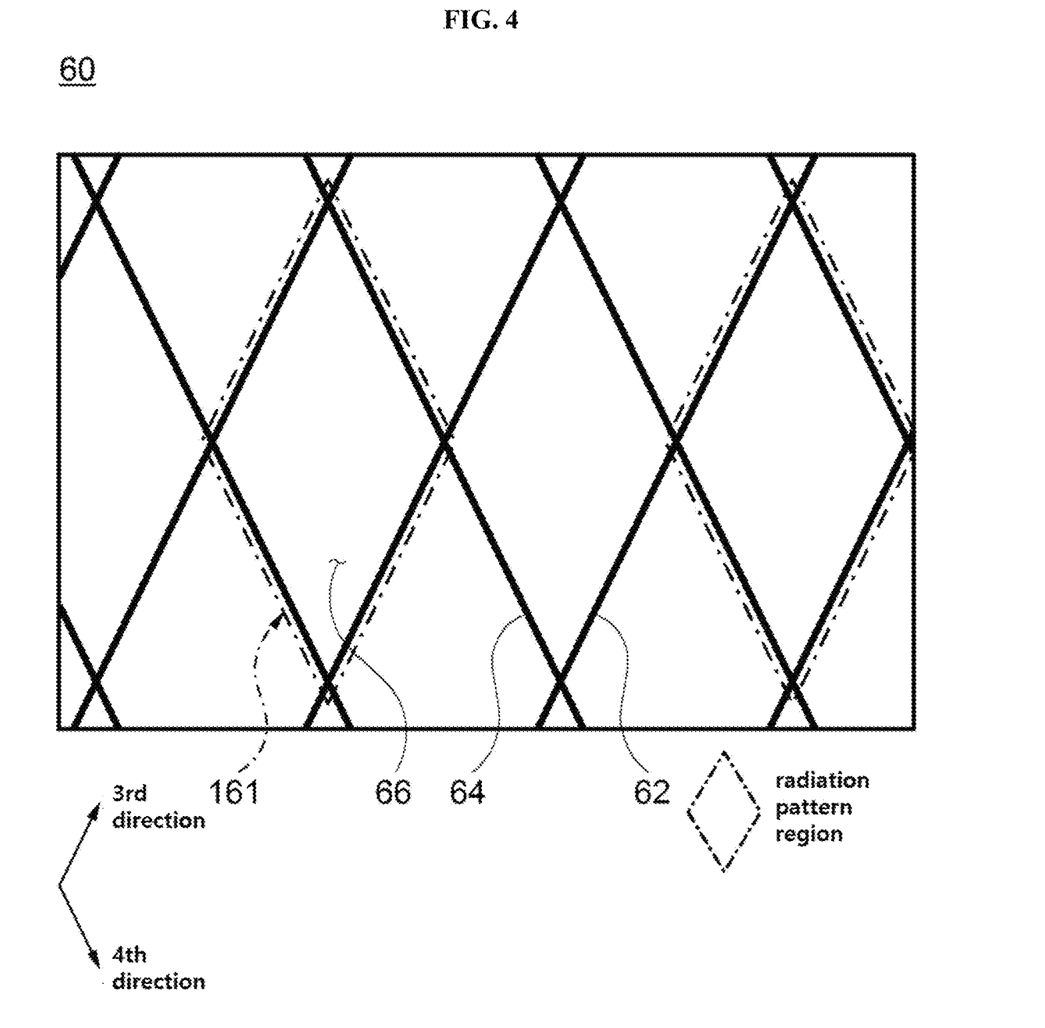
FIG. 4 is a partially enlarged top planar view illustrating a second mesh structure of an antenna-inserted electrode structure in accordance with exemplary embodiments.
Figure 5:
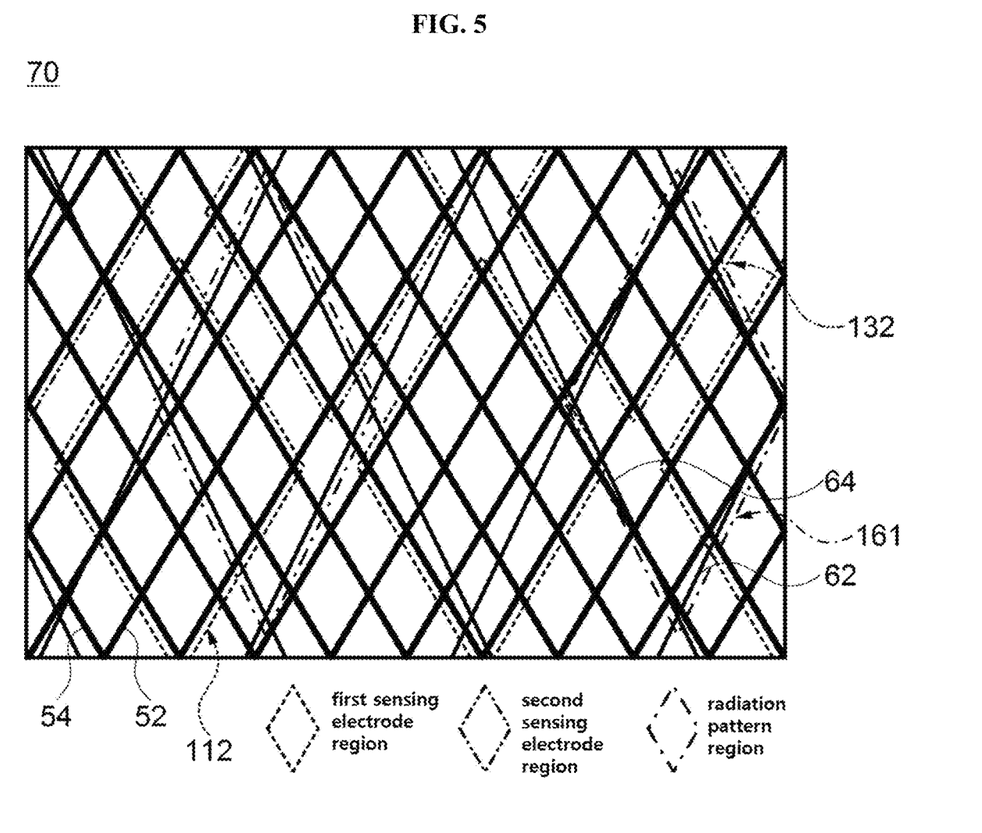
FIG. 5 is a partially enlarged top planar view illustrating a hybridized mesh structure of first and second mesh structures of an antenna-inserted electrode structure in accordance with exemplary embodiments.

FIGS. 3 to 5 are partially enlarged top planar views illustrating mesh structures included in the sensing electrodes and the radiator. For example, FIGS. 3 to 5 are partially enlarged top planar views illustrating regions of the sensing electrodes and the radiator in the touch sensing-antenna area TAR.

Specifically, FIG. 3 is a schematic top planar view illustrating a first mesh structure of an antenna-inserted electrode structure in accordance with exemplary embodiments. FIG. 4 is a partially enlarged top planar view illustrating a second mesh structure of an antenna-inserted electrode structure in accordance with exemplary embodiments.

For convenience of descriptions, FIGS. 3 and 4 illustrate separately the first mesh structure and the second mesh structure from an integrated hybrid mesh structure. FIG. 5 is a partially enlarged top planar view illustrating a hybridized mesh structure of first and second mesh structures of an antenna-inserted electrode structure in accordance with exemplary embodiments.

Referring to FIG. 3, the first mesh structure 50 may include first electrode lines 52 and second electrode lines 54 intersecting each other. The first electrode lines 52 may extend in the first direction. The second electrode lines 54 may extend in the second direction.

The first direction may be parallel to a top surface of the substrate layer 100 and may be inclined by a predetermined angle with respect to the column direction. The second direction may be parallel to the top surface of the substrate layer 100 and may be inclined by a predetermined angle with respect to the row direction.

As described above, the first and second electrode lines 52 and 54 may cross each other, such that the first mesh structure 50 may have a structure in which first unit cells 56 are assembled. The first unit cell 56 may have a rhombus or diamond shape.

The first sensing electrodes 110 and the second sensing electrodes 130 as described with reference to FIG. 1 may form a mesh structure along predetermined sensing electrode regions allocated to the first mesh structure 50. As indicated by dotted diamonds in FIG. 3, a first sensing electrode region 112 and a second sensing electrode region 132 may be allocated to the first mesh structure 50.

As illustrated in FIG. 1, the first sensing electrode 110 and the second sensing electrode 130 may have a polygonal shape such as a rhombus shape or a diamond shape. Accordingly, the first sensing electrode region 112 and the second sensing electrode region 132 may also have substantially the same shape as those of the first sensing electrode 110 and the second sensing electrode 130.

For example, the first sensing electrode region 112 and the second sensing electrode region 132 may be set such that the first sensing electrode 110 and the second sensing electrode 130 may each include the predetermined number of the first unit cells 56.

Referring to FIG. 4, a second mesh structure 60 may include third electrode lines 62 and fourth electrode lines 64 crossing each other. The third electrode lines 62 may extend in a third direction. The fourth electrode lines 64 may extend in the fourth direction.

The third direction may be parallel to the top surface of the substrate layer 100 and may be inclined by a predetermined angle with respect to the column direction. The fourth direction may be parallel to the top surface of the substrate layer 100 and may be inclined by a predetermined angle with respect to the row direction.

In some embodiments, the third direction may be different from the first direction. The fourth direction may be different from the second direction. Accordingly, the third and fourth electrode lines 62 and 64 included in the second mesh structure 60 may extend in different directions from those of the first and second electrode lines 52 and 54.

The third and fourth electrode lines 62 and 64 may intersect each other, such that the second mesh structure 60 may have a structure in which second unit cells 66 may be assembled. The second unit cell 66 may have a polygonal shape such as a rhombus shape or a diamond shape.

The radiator 160 as described with reference to FIG. 1 may be formed by etching the mesh structure along a radiator region allocated to the second mesh structure 60. As indicated by a dotted rhombus in FIG. 4, the radiator region 161 may be allocated to the second mesh structure 60.

In exemplary embodiments, the second mesh structure 60 may be formed by extending an electrode line from each side of the radiator 160. Accordingly, the third and fourth electrode lines 62 and 64 may be extension lines from each side of the radiator 160.

Additionally, some of the second unit cells 66 included in the second mesh structure 60 may substantially form a boundary of the radiator 160.

Referring to FIG. 5, a mesh structure 70 may have a structure in which the first mesh structure 50 and the second mesh structure 60 as described with reference to FIGS. 3 and 4, respectively, may be mixed or hybridized into one conductive layer. Accordingly, the mesh structure 70 may have a structure in which the first to fourth electrode lines 52, 54, 62 and 64 cross each other.

For example, after forming the mesh structure 70, the radiator 160 may be formed by etching the mesh structure 70 along the radiator region 161 as illustrated in FIG. 4.

As described with reference to FIG. 4, the boundary of the radiator 160 may be substantially defined by one second unit cell 66 included in the second mesh structure 60. Accordingly, the boundary of the radiator 160 may have a substantially seamless continuous linear shape without a tip portion or a protrusion generated when, e.g., an electrode line portion between vertices of the unit cell is cut.

Accordingly, radiation directivity and radiation reliability implemented through the radiator 160 may be improved, and a decrease in radiation efficiency due to the tip portion or the protrusion may be prevented.

The mesh structure 70 may be etched along the sensing electrode regions 112 and 132 described with reference to FIG. 3 such that a portion of the mesh structure 70 corresponding to the radiator 160 may not be etched or cut to form the sensing electrodes 110 and 130.

Although not illustrated in detail in FIGS. 3 and 5 for convenience of descriptions, a portion of the mesh structure 70 corresponding to the transmission line 162 may be patterned together while etching the radiator region 161 to be connected to the radiator 160. Further, a portions of the mesh structure 70 corresponding to the connecting portion 115 may be patterned together to be connected to the first sensing electrode 110.

As described above, according to exemplary embodiments, the sensing electrodes 110 and 130 and the radiator 160 may be formed by etching one mesh structure 70. Accordingly, a thin electrode structure in which the touch sensing and the antenna radiation may be implemented together without an additional process or an additional layer for inserting the antenna unit 170.

Further, the mesh structure 70 may have a hybridized structure of the first and second mesh structures 50 and 60 so that a random property may be increased. Accordingly, a regular overlap with a pixel structure of a display panel to which the antenna-inserted electrode structure is applied may be reduced, and thus a moire phenomenon may also be reduced or avoided.

Figure 6:
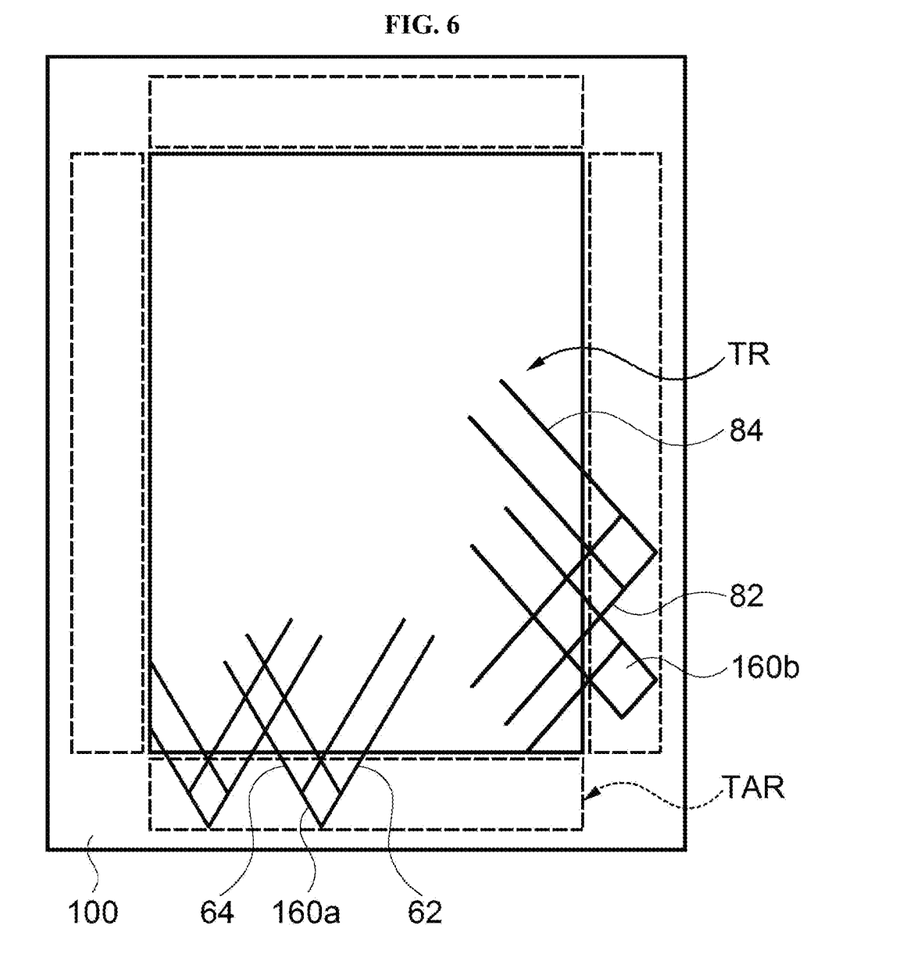
FIG. 6 is a schematic top planar view illustrating an electrode arrangement in an antenna-inserted electrode structure in accordance with exemplary embodiments.

FIG. 6 is a schematic top planar view illustrating an electrode arrangement in an antenna-inserted electrode structure in accordance with exemplary embodiments. For convenience of descriptions, illustration of the sensing electrodes 110 and 130 or the first mesh structure is omitted in FIG. 6.

Referring to FIG. 6, as described above, the substrate layer 100 may include the touch sensing area TR and the touch sensing-antenna area TAR. The touch sensing-antenna area TAR may be allocated around the touch sensing area TR.

For example, as indicated by a dotted rectangle in FIG. 6, the touch sensing-antenna area TAR may be allocated to at least one of both lateral areas, an upper area and a lower area of the substrate layer 100 in a planar view.

In some embodiments, the lower area and one lateral area of the substrate layer 100 may be allocated as the touch sensing-antenna area TAR so that the antenna unit 170 may be inserted. For example, first radiators 160a may be included in the lower area, and second radiators 160b may be included in the one lateral area. The first radiator 160a and the second radiator 160b may have different sizes.

Third and fourth electrode lines 62 and 64 may extend from a boundary of the first radiator 160a to define a second mesh structure. Fifth and sixth electrode lines 82 and 84 may extend from a boundary of the second radiator 160b to define a third mesh structure.

Accordingly, the mesh structure for forming the sensing electrodes 110 and 130 and the radiators 160a and 160b may have a hybrid structure of the first to third mesh structures.

As described above, radiators of different sizes may be inserted through the addition of the mesh structure. Accordingly, the antenna-inserted electrode structure capable of performing a radiation at a plurality of resonance frequencies may be implemented.

Figure 7:
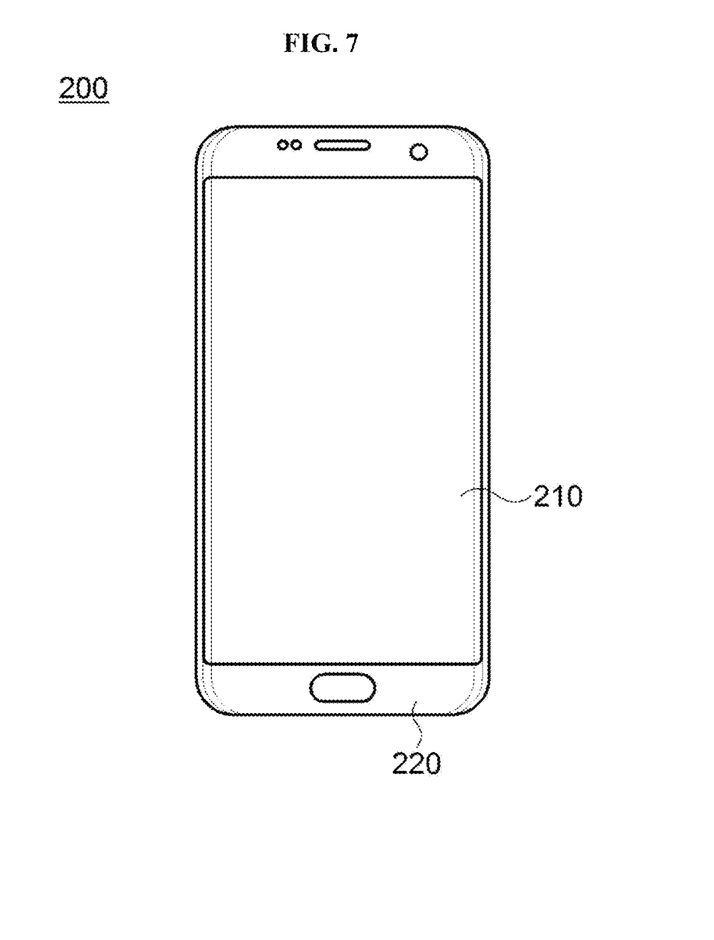
FIG. 7 is a schematic top planar view illustrating an image display device in accordance with exemplary embodiments.

FIG. 7 is a schematic top planar view illustrating an image display device in accordance with exemplary embodiments. For example, FIG. 7 illustrates an outer shape including a window of an image display device.

Referring to FIG. 7, the image display device 200 may include a display area 210 and a peripheral area 220. For example, the peripheral area 220 may be disposed at both lateral portions and/or both end portions of the display area 210. The peripheral area 220 may correspond to, e.g., a light-shielding portion or a bezel portion of the image display device.

The above-described antenna-inserted electrode structure may be disposed over the display area 210 and the peripheral area 220 of the image display device 200, and the first and second sensing electrodes 110 and 130 of the touch sensing area TR may be arranged in the display area 210.

The touch sensing-antenna area TAR may be located over the display area 210 and the peripheral area 220. For example, the radiator 160 of the antenna unit 170 and the sensing electrodes 110 and 130 around the radiator 160 may also be at least partially arranged in the display area 210. As described above, the radiators 160 and the sensing electrodes 110 and 130 may be prevented from being visually recognized to a user by using the mesh structure.

Further, the hybrid mesh structure as described above may be utilized so that visibility of the radiator 160 may be further reduced and the moire phenomenon with the pixel structure of the display panel may be effectively suppressed.

The signal pad 165 of the antenna unit 170 illustrated in FIG. 1 may be disposed in the peripheral area 220. A touch sensor driving IC chip and an antenna driving IC chip may be disposed in the peripheral area 220 to be electrically connected to traces connected to the sensing electrodes 110 and 130 and the signal pad 165 of the antenna unit 170, respectively.

What is claimed is:

1. An antenna-inserted electrode structure, comprising:
   a substrate layer comprising a touch sensing area and a touch sensing-antenna area;
   sensing electrodes disposed on the touch sensing area and the touch sensing-antenna area of the substrate layer; and
   an antenna unit disposed on the touch sensing-antenna area of the substrate layer, the antenna unit comprising a radiator,
   wherein the sensing electrodes and the radiator include a hybrid mesh structure, and the hybrid mesh structure comprises a first mesh structure and a second mesh structure integrally combined with each other, the first mesh structure and the second mesh structure having different shapes and arrangements from each other.

2. The antenna-inserted electrode structure according to claim 1, wherein the first mesh structure comprises first electrode lines and second electrode lines intersecting each other.

3. The antenna-inserted electrode structure according to claim 2, wherein the second mesh structure comprises third electrode lines and fourth electrode lines intersecting each other,
   wherein the third electrode lines and the fourth electrode lines extend in different directions from those of the first electrode lines and the second electrode lines to intersect the first electrode lines and the second electrode lines.

4. The antenna-inserted electrode structure according to claim 3, wherein the third electrode lines and the fourth electrode lines extend from a boundary of the radiator.

5. The antenna-inserted electrode structure according to claim 4, wherein unit cells are defined by the third electrode lines and the fourth electrode lines intersecting each other, and the boundary of the radiator is defined by one of the unit cells.

6. The antenna-inserted electrode structure according to claim 5, wherein the boundary of the radiator has a linear shape extending along an extension direction of the third electrode lines and the fourth electrode lines.

7. The antenna-inserted electrode structure according to claim 3, wherein the radiator comprises a first radiator and a second radiator having different sizes, and the hybrid mesh structure further comprises a third mesh structure.

8. The antenna-inserted electrode structure according to claim 7, wherein the third mesh structure comprises fifth electrode lines and sixth electrode lines intersecting each other, and
the fifth electrode lines and the sixth electrode lines extend in different directions from those of the third electrode lines and the fourth electrode lines.

9. The antenna-inserted electrode structure according to claim 1, wherein the antenna unit further comprises a transmission line formed from the hybrid mesh structure and integrally connected to the radiator, and a signal pad connected to an end portion of the transmission line.

10. The antenna-inserted electrode structure according to claim 9, wherein the signal pad has a solid structure.

11. The antenna-inserted electrode structure according to claim 1, wherein the sensing electrodes include first sensing electrodes arranged along a column direction and second sensing electrodes arranged along a row direction.

12. The antenna-inserted electrode structure according to claim 11, further comprising connecting portions formed from the hybrid mesh structure and integrally connecting the first sensing electrodes along the column direction; and
bridge electrodes electrically connecting the second sensing electrodes to each other along the row direction.

13. The antenna-inserted electrode structure according to claim 1, wherein sensing electrodes arranged in the touch sensing area have a shape different from that of sensing electrodes adjacent to the radiator in the touch sensing-antenna area.

14. The antenna-inserted electrode structure according to claim 13, wherein the sensing electrodes adjacent to the radiator have a shape in which the shape of the sensing electrodes arranged in the touch sensing area is cut or partially removed by a boundary of the radiator.

15. An image display device comprising the antenna-inserted electrode structure according to claim 1.

* * * * *